(12) United States Patent
Doppke et al.

(10) Patent No.: US 6,975,100 B2
(45) Date of Patent: Dec. 13, 2005

(54) CIRCUIT ARRANGEMENT FOR REGULATING THE DUTY CYCLE OF ELECTRICAL SIGNAL

(75) Inventors: Harald Doppke, Mulheim an der Ruhr (DE); Detlev Theil, Dusseldorf (DE); Torsten Harms, Kempen (DE); Stefan van Waasen, Duisburg (DE); Christian Grewing, Dusseldorf (DE)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 10/824,712

(22) Filed: Apr. 14, 2004

(65) Prior Publication Data

US 2005/0134249 A1    Jun. 23, 2005

Related U.S. Application Data

(60) Provisional application No. 60/531,005, filed on Dec. 19, 2003.

(51) Int. Cl.$^7$ .............................. G05F 1/44; G05F 1/56

(52) U.S. Cl. ........................ 323/288; 323/316; 323/283

(58) Field of Search ............................... 323/288, 316, 323/282, 283

(56) References Cited

U.S. PATENT DOCUMENTS

| | | | |
|---|---|---|---|
| 5,912,593 A | 6/1999 | Susak et al. | |
| 6,414,863 B1 * | 7/2002 | Bayer et al. | 363/60 |
| 6,420,861 B2 * | 7/2002 | Ochi et al. | 323/288 |
| 6,690,148 B2 * | 2/2004 | Harrison | 323/281 |
| 6,750,639 B2 * | 6/2004 | Harrison | 323/281 |
| 6,753,675 B2 * | 6/2004 | Harrison | 323/281 |
| 2003/0146779 A1 | 8/2003 | Kao | |

* cited by examiner

Primary Examiner—Bao Q. Vu
(74) Attorney, Agent, or Firm—Bever, Hoffman & Harms, LLP; Patrick T. Bever

(57) ABSTRACT

A circuit arrangement for regulating the duty cycle of an electrical signal including a first input differential amplifier, to which an input signal is applied; a first current source for controlling the current through the first input differential amplifier; a second input differential amplifier, to which the same input signal is applied; a second current source for controlling the current through the second input differential amplifier; a device which generates a fluctuating voltage signal from output signals of the two input differential amplifiers; a buffer device, which converts the fluctuating voltage signal into a digital output signal; a capacitance and a device for charging and discharging the capacitance in time with the digital output signal. The voltage present at the capacitance is fed to the first and second current sources as control voltage and effects regulation of the two current sources in opposite senses.

16 Claims, 2 Drawing Sheets

CIRCUIT ARRANGEMENT FOR REGULATING THE DUTY CYCLE OF ELECTRICAL SIGNAL

RELATED APPLICATION

The present application is claims priority of U.S. Patent Application Ser. No. 60/531,005 filed by Harald Doppke, Detlev Theil, Torsten Harms, Stefan van Waasen and Christian Grewing on Dec. 19, 2003.

FIELD OF THE INVENTION

The invention relates to a circuit arrangement for regulating the duty cycle of an electrical signal. It is employed in particular in the regulation of the duty cycle of dynamic interface signals in digital communication systems.

BACKGROUND OF THE INVENTION

A "duty cycle" is a term which in digital communication systems denotes the on/off ratio in an electrical signal. In particular, the duty cycle specifies the percentage with which a high level is present in a signal. The duty cycle is ideally 50% or 0.5.

The duty cycle represents an important criterion of dynamic interface signals in digital communication systems. Dynamic interface signals are, in particular, input and output signals of digital communication components. For the duty cycle, there are generally very restrictive specifications in order to ensure the function of individual components in an overall system. The higher the number of components, the more the specification has to be restricted. Complying with this specification under all boundary conditions such as temperature, supply voltage and manufacturing tolerances often constitutes a problem.

It is known, in the case of a large number of system components in a signal chain, to regularly incorporate a retiming stage (clock recovery) in order to regenerate the signal again with regard to its requirements. In this case, the signal is refreshed in particular with regard to jitter and duty cycle. However, such retiming stages disadvantageously require a considerable outlay on additional system components.

SUMMARY OF THE INVENTION

The present invention is directed to a circuit arrangement for regulating the duty cycle of an electrical signal which enables the duty cycle to be set in a simple manner.

The present invention provides a circuit arrangement having:
a first input differential amplifier with two transistors, to which an input signal is applied,
a first current source for controlling the current through the first input differential amplifier,
a second input differential amplifier with two transistors, to which the same input signal is applied,
a second current source for controlling the current through the second input differential amplifier,
a device which generates a voltage signal from the currents of the two input differential amplifiers, the level of which voltage signal fluctuates,
a buffer device, which converts the fluctuating voltage signal into a digital output signal and leads to an output,
a capacitance, and
a device for charging and discharging the capacitance in time with the digital output signal,
the voltage present at the capacitance being fed to the first and second current sources as control voltage and effecting regulation of the two current sources in opposite senses.

The circuit arrangement according to the invention is based on the concept of regulating the current sources for the two input differential amplifiers in such a way that the output signal has the desired duty cycle, and of using the output signal itself as the regulated variable in this case. By means of the currents through the two input differential amplifiers the changeover points of the signal considered can be shifted very well over wide ranges. It is also possible to set the rapidity of the input differential amplifier stages and thus the rise and fall times in a manner dependent on the current made available. In this case, it must be taken into account that the two current sources are regulated in opposite senses by the capacitance: to the extent to which the current through one current source increases, the current through the other current source decreases. A constant current, as it were, depending on the regulation, is divided between the two current sources for the two input differential amplifiers.

The solution according to the invention provides for the actual output signal to be regulated directly. In this case, the output signal represents a regulated variable for the device for charging and discharging the capacitance in time with the digital output signal. The voltage present at the capacitance is fed to the current sources for the input differential amplifiers as a manipulated variable. The current sources themselves represent an actuator of the regulation. The device for charging and discharging the capacitance represents, together with the capacitance, a regulating device.

The solution according to the invention provides a regulation via the complete relevant signal path. Thus, the regulating signal is passed to the current sources for controlling the current through the two input differential amplifiers, at which the input signal is present. A regulation is thus effective from the input as far as the output. This means that it is directly possible also to correct inaccuracies in the input signal and also to reconstruct input signals with a poor duty cycle. In this case, it is unimportant whether the output signal is present as a voltage signal or as a current signal. Furthermore, a simple possibility is provided for setting the duty cycle as desired, i.e. also to different values than 50%.

In one preferred refinement of the invention, the device for charging and discharging the capacitance in time with the digital output signal is provided by a charge pump with two current sources, one of the current sources charging the capacitance and the other of the current sources discharging the capacitance. In this arrangement, the value of the duty cycle set in this case results directly from the ratio of the charge pump currents to the sum of the charge pump currents, since the summation charge at the capacitance must be zero in the adjusted case. Consequently, by means of the currents of the two charge pump current sources, it is possible to define the desired value for the duty cycle in a simple manner.

In a further preferred refinement, the device which generates a voltage signal from the currents of the two input differential amplifiers, the level of which voltage signal fluctuates, is formed by two current mirror circuits each having a current mirror comprising a first current mirror transistor and a second current mirror transistor. In this case, a transistor of one current mirror and a transistor of the other current mirror are connected to one another. The voltage signal whose level fluctuates is tapped off between these two transistors.

In particular, each current mirror circuit has: a first transistor, which is identical to one of the transistors of the respective input differential amplifier, and a current mirror comprising a first current mirror transistor and a second current mirror transistor with a reference current and a control current. The reference current for the current mirror is formed by the current generated by the first transistor. The first transistor and the first current mirror transistor are in each case connected in series and the two second current mirror transistors of the two current mirrors are connected to one another. The voltage signal whose level fluctuates is then tapped off between these transistors.

The circuit arrangement has an output stage, which may be realized both with a current output and with a voltage output.

BRIEF DESCRIPTION OF THE DRAWINGS

The invention is explained in more detail below using an exemplary embodiment with reference to the figures, in which.

DESCRIPTION OF A PLURALITY OF PREFERRED EXEMPLARY EMBODIMENTS

Figure 1:
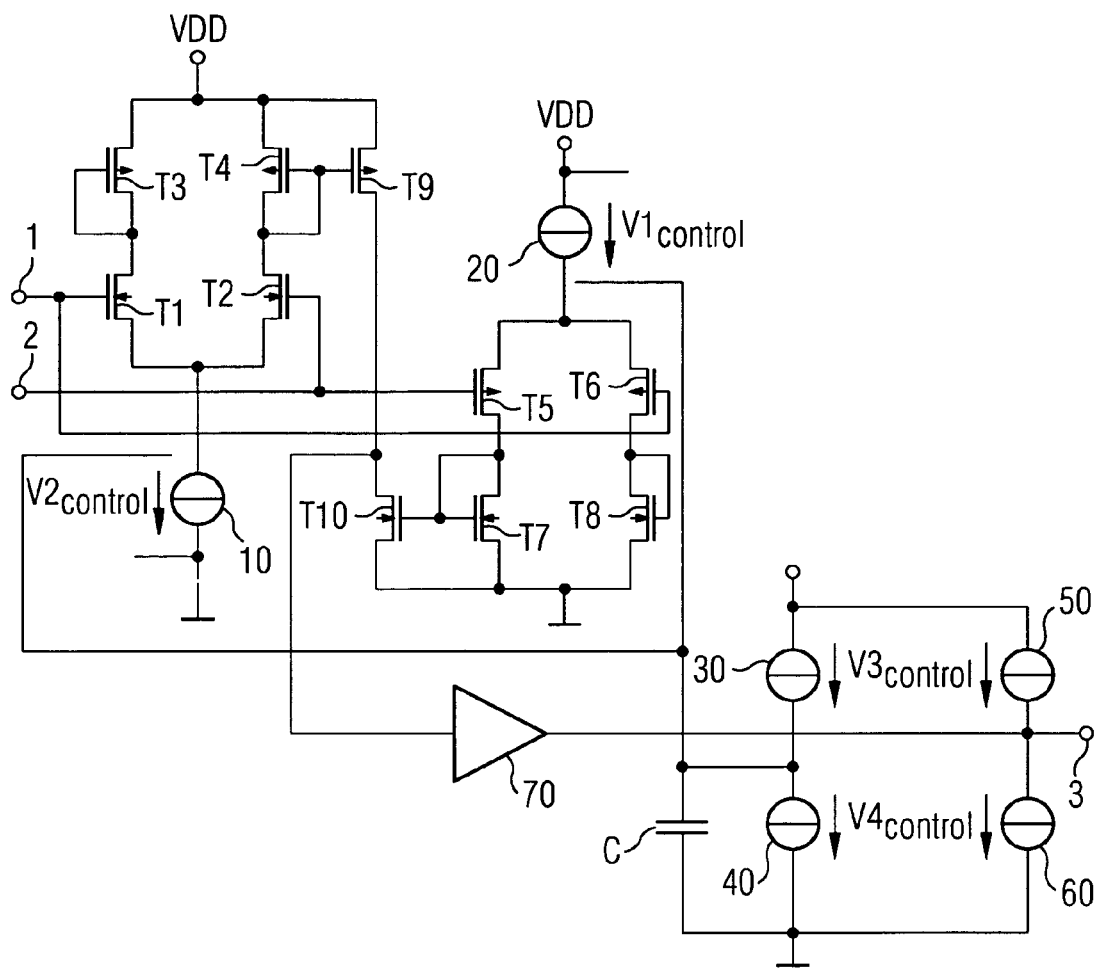
FIG. 1 shows a circuit arrangement for regulating the duty cycle of an electrical signal with a current output.

FIG. 1 shows a circuit arrangement having two input differential amplifiers each having two transistors T1, T2 and T5, T6, respectively. The transistors T1, T2 are n-channel FET (field-effect transistor) transistors and the transistors T5, T6 are p-channel FET transistors. The source terminal of the two transistors T1, T2 is interconnected and connected to a current source 10, which can be regulated by means of a voltage $V2_{control}$ and the other end of which is connected to ground. The regulatable current source is a FET transistor, for example, it being possible to set the current of the current source and thus through the differential amplifier by means of the gate voltage $V2_{control}$.

In a corresponding manner, the source terminals of the transistors T5, T6 of the second input differential amplifier are connected to the operating voltage $V_{DD}$ via a current source 20, which can be regulated by means of a voltage $V1_{control}$.

Firstly, the first input differential amplifier shall be considered. A p-channel FET transistor T3, which provides an active load, is connected in series with one transistor T1 of the differential amplifier. Equally, a p-channel FET transistor T4, which likewise provides an active load, is connected in series with the other transistor T2 of the input differential amplifier. The source terminals of the transistors T3, T4 are connected to the operating voltage $V_{DD}$ and the drain terminals of the transistors T3, T4 are connected to the drain terminals of the transistors T1, T2.

Furthermore, a current mirror is provided by means of a further transistor T9. The transistor T9 is a p-channel FET transistor whose source terminal is connected to the positive operating voltage. The gate terminal of the transistor T9 is connected to the gate terminal of the transistor T4. At the same time, the gate terminal of the transistor T4 is connected to the drain terminal of the transistor T2. A current mirror circuit known per se is present.

The function of the current mirror is as follows: the current generated by the transistor T2 represents a reference current of the current mirror, which flows through the transistor T4. The current mirror then generates a control current, which is in a specific ratio to the reference current and which flows through the transistor T9.

A mirror-image construction of a current mirror circuit is formed in the second input differential amplifier with the transistors T5, T6, T7, T8 and T10. The transistors T7, T8 and T10 are in each case n-channel FET transistors. The drain terminal of the transistor T10 is connected to the drain terminal of the transistor T9.

An input signal is fed to the two input differential amplifiers via two input terminals 1, 2, said input signal comprising a sequence of high and low voltage signals, the input signal possibly having a poor quality and, in particular, not having a desired duty cycle. The two input differential stages are controlled by the input signal in such a way that, given a high signal, one of the transistors T5 and T2, turns on, while the other transistor does not turn on and, given a low signal, the other of the transistors T5 and T2, turns on, while the other transistor does not turn on. By way of example, given a high signal, a current flows along a (first) branch of the first input differential amplifier through the transistors T2, T4 and thus also through one transistor T9 of the mirror circuit. At the same time, the transistor T5 of the other input differential amplifier turns off.

When a low signal is present, the transistor T2 of the first input differential amplifier turns off, while the transistor T5 of the second input differential amplifier turns on, so that a current flows along a (second) branch of the second input differential amplifier through the transistors T5, T7 and thus also through the transistor T10 of the mirror circuit.

A voltage is tapped off between the transistors T9 and T10. This voltage fluctuates between a low value and a high value in accordance with the currents—provided by means of the current sources 10, 20—through the respective input differential amplifiers, which determine the currents through the mirror circuits or the transistors T9, T10. If the transistor T9 turns on, the transistor T10 turns off, and vice versa, so that the voltage VDD and near or equal to the ground voltage is alternately tapped off between the two transistors T9, T10.

The tapped-off voltage signal is fed to a digital buffer device 70, which converts the tapped-off voltage signal into a digital output signal and feeds it to an output 3 of the circuit arrangement. In this case, the buffer device 70 serves for insulating the downstream output stage from the preceding circuit parts and for converting the tapped-off voltage signal into a digital signal. Unlike the signal tapped off between the transistors T9, T10, the digital signal fulfils specific requirements made of the signal quality, in particular made of the constancy of the signal amplitude, edge steepness and jitter. The digital buffer 70 comprises a comparator in this case. The buffer device 70 may be provided with or without signal inversion.

The circuit arrangement furthermore has an output stage with a current output. The latter is formed by current sources 30, 40, 50, 60. The current sources 50, 60 provide a first charge pump, which serve only for providing a current at the output 3. In this case, the charge pump is modulated directly by the output signal. A further charge pump comprises two current sources 30, 40, the currents of which are controlled by control voltages $V3_{control}$, $V4_{control}$. One current source 30 provides a current which charges a capacitance C. The other current source 40 provides a current which discharges the capacitance C. In this case, the charging and discharging are effected in time with the output signal of the buffer device 70.

The functioning of the circuit arrangement is explained below. In this case, it shall first of all be assumed that the voltages $V3_{control}$, $V4_{control}$ for controlling the two current sources 30, 40 of the output stage are identical. Given a corrected duty cycle, on average no current flows to the capacitance C: the charging currents and the discharging currents are identical in terms of magnitude. The capacitance C acts as an integrating element having a slow regulation characteristic. The voltage present across the capacitance C is fed on the one hand as control voltage $V1_{control}$ to the current source 20 of the second input differential amplifier and on the other hand as control voltage $V1_{control}$ to the current source 10 of the first input differential amplifier.

It shall be assumed that the input signal has a duty cycle not equal to 50%. This has the effect that, on account of the signal asymmetry, the current sources 30, 40 of the output stage charge or discharge the capacitance C for different lengths of time, so that the voltage across the capacitance C rises or falls. The changing voltage is fed as actuation signal, as explained, to the current sources 10, 20 for the first and second input differential amplifiers. Since one current source 10 is connected to ground and the other current source 20 is connected to the operating voltage VDD, the current through the current sources 10, 20 changes in opposite senses in the event of a changing control voltage $V2_{control}$, $V2_{control}$: while the current through one current source increases, the current through the other current source decreases, and vice versa.

By means of the currents however, it is possible to set the rapidity of the input differential stages and thus also the rise and fall times at the output of the differential stage. By way of example, the rapidity of the first input differential amplifier increases in the event of an increased current at the current source 10 of the first input differential amplifier, while an opposite behavior is present in the case of the other current source 20 and the other input differential amplifier.

The regulation has the effect that the duty cycle is set to a value of 50%. It is then the case that on average no more current flows to the capacitance C and the system is corrected.

If $V3_{control}$ is not equal to $V4_{control}$, i.e. the current signals provided by the current sources 30, 40 are not identical in terms of magnitude, a duty cycle setting to a value not equal to 50% may be effected in a simple manner. The value of the duty cycle set results directly from the ratio of the currents through the two current sources 30, 40 to the sum of said currents. A simple method for setting the desired value for the duty cycle is thus provided.

Attention is additionally drawn to the following, moreover.

A voltage input signal is the basis for the function of the circuit arrangement. Therefore, when a current input signal is utilized, it is necessary additionally to use a current-voltage converter at the input of the circuit arrangement.

The input signal may be both single-ended and differential. In the case of a differential driving, mutually inverted input signals are present at the two input terminals 1, 2. In the case of a single-phase (single-ended) driving, a data signal is present only at one input terminal. For this case, a corresponding reference voltage must be fed to the other input terminal.

The circuit apparatus described here is preferably embodied in CMOS technology. However, it is also possible in an equivalent manner to embody corresponding circuits in bipolar technology and in BiCMOS technology.

Figure 2:
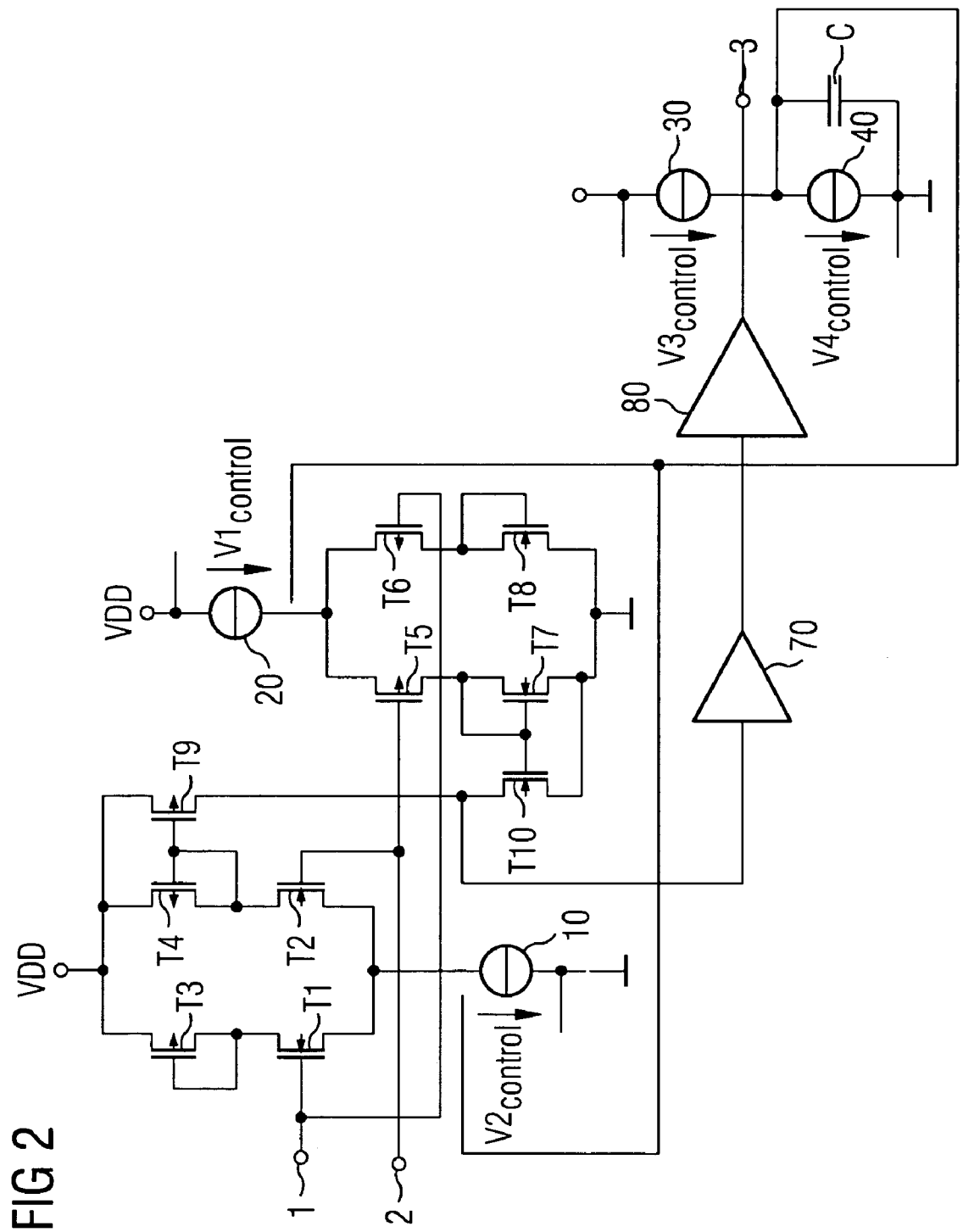
FIG. 2 shows a circuit arrangement for regulating the duty cycle of an electrical signal with a voltage output.

The circuit arrangement in accordance with FIG. 2 differs from the circuit arrangement in accordance with FIG. 1 only insofar as a voltage output of the circuit arrangement is provided. In this case, the charge pump 30, 40 for charging or discharging the capacitance 10 is driven directly with the output signal. An amplifier 80 provides for an additional voltage amplification of the output signal of the digital buffer 70. Otherwise, there are no differences with respect to the circuit arrangement of FIG. 1, so that reference is made to the explanations in this respect.

The configuration of the invention is not restricted to the exemplary embodiments presented above. The person skilled in the art recognizes that numerous alternative embodiment variants exist which, despite their deviation from the exemplary embodiment described, make use of the teaching defined in the claims hereinafter.

We claim:

1. A circuit arrangement for regulating the duty cycle of an electrical signal, the circuit arrangement comprising:
    a first input differential amplifier including two transistors, to which a first input signal is applied,
    a first current source for controlling a first current through the first input differential amplifier,
    a second input differential amplifier including two transistors, to which the first input signal is applied,
    a second current source for controlling a second current through the second input differential amplifier,
    means for generating a fluctuating voltage signal in response to the first and second currents,
    a buffer device for converting the fluctuating voltage signal into a digital output signal, and for transmitting the digital output signal to an output terminal,
    a capacitance, and
    means for charging and discharging the capacitance in synchronization with the digital output signal,
    wherein a voltage present at the capacitance is fed to the first and second current sources as a control voltage such that regulation of the two current sources is effected in opposite senses.

2. The circuit arrangement as claimed in claim 1, wherein the first input differential amplifier comprises two n-channel FET transistors, and the first current source is connected between ground and source terminals of the transistors of the first input differential amplifier.

3. The circuit arrangement as claimed in claim 1, wherein the second input differential amplifier comprises two p-channel FET transistors, and the second current source is connected between an operating voltage and source terminals of the transistors of the second input differential amplifier.

4. The circuit arrangement as claimed in claim 1, wherein the means for charging and discharging the capacitance comprises a charge pump with a first current source for charging the capacitance, and a second current source for discharging the capacitance, and wherein one of the first and second current sources is activated in response to the presence of a high digital output signal and the other of the two current sources is activated in response to the presence of a low digital output signal, thereby respectively charging and discharging the capacitance.

5. The circuit arrangement as claimed in claim 1, wherein the means for generating the fluctuating voltage signal from the first and second currents is formed by first and second current mirror circuits, the first and second current mirror circuits respectively comprising a first current mirror transistor and a second current mirror transistor connected in series, wherein the fluctuating voltage signal is tapped off between the first and second current mirror transistors.

6. The circuit arrangement as claimed in claim 5, wherein each of the first and second current mirror circuits comprises:
   a first transistor, which is identical to one of the transistors of the respective input differential amplifier,
   a current mirror comprising a first current mirror transistor and a second current mirror transistor with a reference current and a control current,
   the reference current of the current mirror being formed by the current generated by the first transistor,
   the first transistor and the first current mirror transistor being connected in series and
   wherein the second current mirror transistor of the two current mirrors being connected to one another and the voltage signal whose level fluctuates being tapped off between these transistors.

7. The circuit arrangement as claimed in claim 1, further comprising an output stage providing a current output.

8. The circuit arrangement as claimed in claim 1, further comprising an output stage providing a voltage output.

9. The circuit arrangement as claimed in claim 1, wherein the individual transistors are embodied in one of CMOS technology, as bipolar transistors, and embodied in BiCMOS technology.

10. A circuit arrangement for regulating the duty cycle of an electrical signal, the circuit arrangement comprising:
   a first current source for generating a first current;
   a first differential amplifier for passing the first current along a first branch when the electrical signal has a first voltage value;
   a first current mirror circuit including a first current mirror transistor having a gate terminal connected to the first branch of the first differential amplifier;
   a second current source for generating a second current;
   a second differential amplifier for passing the second current along a second branch when the electrical signal has a second voltage value;
   a second current mirror circuit including a second current mirror transistor connected in series with the first current transistor, wherein the second current mirror transistor has a gate terminal connected to the second branch of the second differential amplifier;
   a buffer device for converting a fluctuating voltage signal generated between the first and second current mirror transistors into a digital output signal, and for transmitting the digital output signal to an output terminal;
   a capacitor; and
   means for charging and discharging the capacitor in synchronization with the digital output signal,
   wherein a control voltage generated across the capacitor is fed to the first and second current sources, and
   wherein the first and second current sources respectively regulate the first and second currents in response to the control signal such that a duty cycle of the digital output signal is set to a predetermined value.

11. The circuit arrangement as claimed in claim 10,
   wherein the first current source is connected between the first differential amplifier and ground, and
   wherein the second current source is connected between an operating voltage source and the second differential amplifier.

12. The circuit arrangement as claimed in claim 11, wherein the first differential amplifier comprises first and second n-channel transistors having source terminals connected to the first current source, the first n-channel transistor having a gate terminal connected to receive an inverted electrical signal, and the second n-channel transistor having a gate terminal connected to receive the electrical signal and a drain terminal connected to the first branch, and
   wherein the second differential amplifier comprises first and second p-channel transistors having drain terminals connected to ground, the first p-channel transistor having a gate terminal connected to receive the electrical signal and a source terminal connected to the second branch, and the second p-channel transistor having a gate terminal connected to receive the inverted electrical signal.

13. The circuit arrangement as claimed in claim 12, further comprising:
   third and fourth p-channel transistors respectively connected in series with the first and second n-channel transistors between the operating voltage source and the first current source, wherein a gate terminal of the third p-channel transistor is connected to a drain terminal of the first n-channel transistor, and a gate terminal of the fourth p-channel transistor is connected to a drain terminal of the second n-channel transistor and to the gate terminal of the first current mirror transistor; and
   third and fourth n-channel transistors respectively connected in series with the first and second p-channel transistors, the third and fourth n-channel transistors having source terminals connected to ground, wherein a gate terminal of the third n-channel transistor is connected to a drain terminal of the first p-channel transistor and to the gate terminal of the second current mirror transistor, and a gate terminal of the fourth n-channel transistor is connected to a drain terminal of the second p-channel transistor.

14. The circuit arrangement as claimed in claim 13,
   wherein the first current mirror transistor comprises a p-channel transistor, and wherein the second current mirror transistor comprises an n-channel transistor.

15. The circuit arrangement as claimed in claim 10, wherein the means for charging and discharging the capacitor comprises:
   a first current source connected between the system voltage source and a first terminal of the capacitor;
   a second current source connected in parallel with the capacitor and having a terminal connected to ground; and
   means for controlling the first and second current sources such that the first current source is activated and the second current source is deactivated when the digital output signal has a first voltage value, thereby charging the capacitor, and such that the first current source is deactivated and the second current source is activated when the digital output signal has a second voltage value, thereby discharging the capacitor.

16. A circuit arrangement for regulating the duty cycle of an electrical signal, the circuit arrangement comprising:
   a first current source for generating a first current in response to a control voltage;
   a first differential amplifier connected to the first current source such that the first current source is connected between the first differential amplifier and ground, wherein the first differential amplifier includes an n-channel transistor for passing the first current when the electrical signal has a first voltage value;

a second current source for generating a second current in response to the control voltage;

a second differential amplifier connected to the second current source such that the second current source is connected between the second differential amplifier and an operating voltage source, wherein the second differential amplifier includes a p-channel transistor for passing the second current when the electrical signal has a first voltage value;

a p-channel current mirror transistor having a source connected to the operating voltage source, and a gate terminal connected to a drain terminal of the n-channel transistor;

an n-channel current mirror transistor having a source connected to ground, a gate terminal connected to a drain terminal of the p-channel transistor, and a drain terminal connected to a drain terminal of the p-channel current mirror transistor;

means for generating a digital output signal in response to a fluctuating voltage signal generated at the drain terminals of the n-channel and p-channel current mirror transistors, and means for generating the control signal applied to the first and second current sources in response to the digital output signal such that the first and second current sources respectively regulate the first and second currents in a manner that sets a duty cycle of the digital output signal to a predetermined value.

* * * * *